United States Patent
Hung et al.

(10) Patent No.: US 11,301,151 B2
(45) Date of Patent: Apr. 12, 2022

(54) MULTI-DIE MEMORY APPARATUS AND IDENTIFICATION METHOD THEREOF

(71) Applicant: MACRONIX International Co., Ltd., Hsinchu (TW)

(72) Inventors: Chun-Hsiung Hung, Hsinchu (TW); Su-Chueh Lo, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/870,848

(22) Filed: May 8, 2020

(65) Prior Publication Data
US 2021/0349645 A1 Nov. 11, 2021

(51) Int. Cl.
*G06F 3/06* (2006.01)
*H01L 25/065* (2006.01)

(52) U.S. Cl.
CPC .......... *G06F 3/0632* (2013.01); *G06F 3/0604* (2013.01); *G06F 3/0673* (2013.01); *H01L 25/0657* (2013.01); *H01L 2225/06541* (2013.01)

(58) Field of Classification Search
CPC ............... G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004;
(Continued)

(56) References Cited

U.S. PATENT DOCUMENTS 5,530,860 A * 6/1996 Matsuura .............. G06F 9/5027
718/105
5,719,879 A * 2/1998 Gillis .............. G01R 31/318558
365/201

(Continued)

OTHER PUBLICATIONS

K. Khalifa, H. Fawzy, S. El-Ashry and K. Salah, "Memory controller architectures: A comparative study," 2013 8th IEEE Design and Test Symposium, 2013, pp. 1-6, doi: 10.1109/IDT.2013.6727083. (Year: 2013).*
(Continued)

*Primary Examiner* — Daniel C. Chappell
(74) *Attorney, Agent, or Firm* — J.C. Patents (57) ABSTRACT

A multi-die memory apparatus and identification method thereof are provided. The identification method includes: sending an identification initial command and a first start command to a plurality of memory devices by a controller for starting a first identification period; respectively generating a plurality of first target numbers by the memory devices; respectively performing first counting actions and comparing a plurality of first counting numbers with the first target numbers by a plurality of un-identified memory devices to set a first time-up memory device of the memory devices; and, setting an identification code of the first time-up memory device of the un-identified memory devices to be a first value.

18 Claims, 5 Drawing Sheets

(58) Field of Classification Search
CPC ........ G06F 2216/00–17; G06F 2221/00–2153; G11B 20/00–24; G11B 33/00–1493; G11C 7/00–24; G11C 11/00–5692
See application file for complete search history.

(56) References Cited

U.S. PATENT DOCUMENTS

| | | | | |
|---|---|---|---|---|
| 5,787,462 | A * | 7/1998 | Hafner | H01L 23/34 257/E23.08 |
| 5,937,423 | A * | 8/1999 | Robinson | G11C 16/10 365/52 |
| 7,200,743 | B1 * | 4/2007 | Malpass | G06F 13/4234 713/1 |
| 8,090,924 | B2 * | 1/2012 | Petrocelli | G06F 1/3203 711/170 |
| 9,214,211 | B2 * | 12/2015 | Chan | G11C 8/18 |
| 10,014,038 | B2 * | 7/2018 | Morohashi | G11C 7/1087 |
| 2002/0105096 | A1 * | 8/2002 | Hirata | H01L 25/0657 257/E23.07 |
| 2003/0005278 | A1 * | 1/2003 | Deng | G06F 3/0607 713/2 |
| 2004/0148482 | A1 * | 7/2004 | Grundy | G06F 13/1689 711/167 |
| 2006/0022324 | A1 * | 2/2006 | Yu | H01L 25/03 257/E25.023 |
| 2006/0175715 | A1 * | 8/2006 | Hirose | H01L 25/0657 257/E25.023 |
| 2007/0096266 | A1 * | 5/2007 | Yu | G11C 5/02 257/E25.023 |
| 2008/0147964 | A1 * | 6/2008 | Chow | G06F 21/34 711/E12.001 |
| 2008/0177923 | A1 * | 7/2008 | Klein | G11B 7/14 710/306 |
| 2009/0003103 | A1 * | 1/2009 | Shimizu | G11C 16/30 365/201 |
| 2009/0172499 | A1 * | 7/2009 | Olbrich | G06F 3/0604 714/773 |
| 2011/0161568 | A1 * | 6/2011 | Bruce | G06F 12/0246 711/103 |
| 2012/0005402 | A1 * | 1/2012 | Yamamoto | G11C 16/349 711/E12.008 |
| 2012/0311271 | A1 * | 12/2012 | Klein | G06F 12/0873 711/141 |
| 2013/0246694 | A1 * | 9/2013 | Bruce | G06F 13/36 711/103 |
| 2014/0289441 | A1 * | 9/2014 | Bruce | G06F 13/1673 710/308 |
| 2019/0087363 | A1 * | 3/2019 | Bruce | G06F 12/0246 |

OTHER PUBLICATIONS

H. Kim, K. Han and D. Shin, "StreamFTL: Stream-level address translation scheme for memory constrained flash storage," 2018 Design, Automation & Test in Europe Conference & Exhibition (DATE), 2018, pp. 617-620, doi: 10.23919/DATE.2018.8342083. (Year: 2018).*

J. Zhang, M. Kwon, H. Kim, H. Kim and M. Jung, "FlashGPU: Placing New Flash Next to GPU Cores," 2019 56th ACM/IEEE Design Automation Conference (DAC), 2019, pp. 1-6. (Year: 2019).*

Z. Xu, R. Li and C.-Z. Xu, "CAST: A page level FTL with compact address mapping and parallel data blocks," 2012 IEEE 31st International Performance Computing and Communications Conference (IPCCC), 2012, pp. 142-151, doi: 10.1109/PCCC.2012.6407747. (Year: 2012).*

* cited by examiner

FIG. 6

MULTI-DIE MEMORY APPARATUS AND IDENTIFICATION METHOD THEREOF

BACKGROUND OF THE INVENTION

1. Field of the Invention

The present invention generally relates to a multi-die memory apparatus and an identification method thereof, in particular, to the multi-die memory apparatus for performing the identification method without boding difference.

2. Description of Related Art

Multi-die package or stacked-die package apparatuses that encloses a number of integrated circuits (IC) in a chip carrier package has been widely used to maximize the capacities and performance as well as the area. In a multi-die memory apparatus, to individually access each of the memory devices, however, there should be some identification mechanism between these memory devices (chips) so a controller could specify a memory device that it wants to access.

In conventional art, a bonding difference to identify each of the memory devices is widely used. However, in some three-dimension (3D) integrated circuit (IC) packaging technology such as through-silicon-via (TSV), the memory devices are vertically stacked and all the pads have to be connected in the same way among the memory devices. This makes the above described bonding identification method infeasible.

SUMMARY OF THE INVENTION

The present invention provides a memory apparatus and an identification method thereof which can identification individual memory device without using bonding difference.

The identification method includes: sending a identification initial command and a first start command to a plurality of memory devices by a controller for starting a first identification period; respectively generating a plurality of first target numbers by the memory devices; respectively performing first counting actions and comparing a plurality of first counting numbers with the first target numbers by a plurality of un-identified memory devices to set a first time-up memory device of the memory devices; and, setting an identification code of the first time-up memory device of the un-identified memory devices to be a first value.

The memory apparatus includes a controller and a plurality of memory devices. The memory devices are coupled to the controller. The memory apparatus performs the identification method mentioned above to identify each of the memory devices for accessing.

Based on the above, in the present disclosure, the memory devices in the multi-die memory apparatus generate a plurality of target numbers. The memory devices perform counting operation and compare counting numbers with the target numbers to determine the first time-up memory device. That is, the identification code of the first time-up memory device can be set accordingly, and no special bonding structure is necessary for the memory devices.

In order to make the aforementioned and other objectives and advantages of the present invention comprehensible, embodiments accompanied with figures are described in detail below.

DESCRIPTION OF THE EMBODIMENTS

Figure 1:
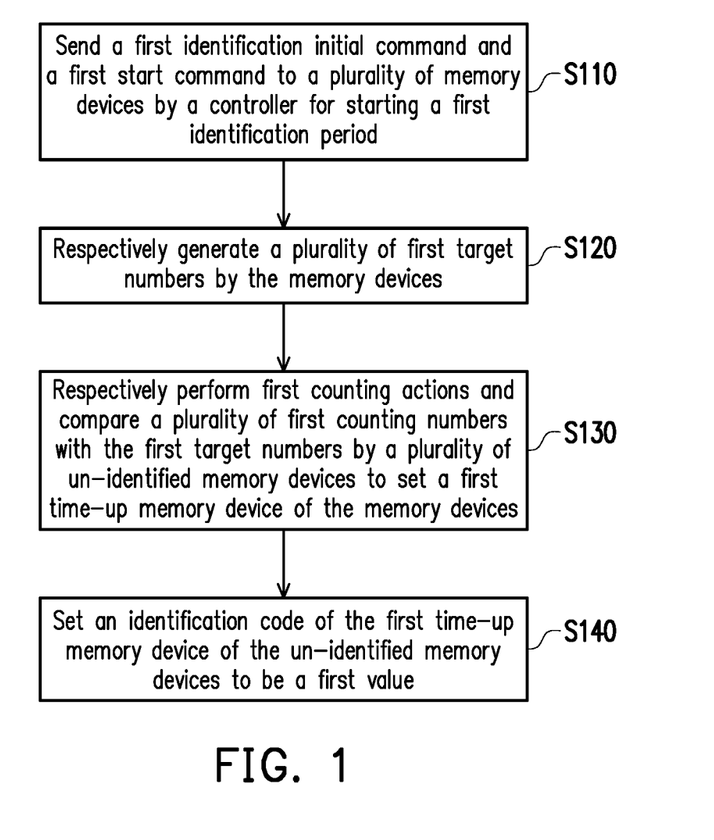
FIG. 1 is a flow chart of an identification method for a multi-die memory apparatus according to an embodiment of present disclosure.

Referring to FIG. 1, which is a flow chart of an identification method for a multi-die memory apparatus according to an embodiment of present disclosure. The multi-die memory apparatus includes a controller and a plurality of memory devices. The controller is coupled to the memory devices. The memory devices may be arranged by a stack structure, and may be connected to each other by through-silicon-vias (TSVs). Each of the memory devices may be one die, and may be a flash memory die. In the identification method of present disclosure, in a step S110, the controller sends a identification initial command and a first start command to the memory devices for starting a first identification period. The identification initial command is used to enable an identification operation, and the first start command is used to start a first identification period of the identification operation.

In a step S120, the memory devices respectively generate a plurality of first target numbers. In this embodiment, each of the memory devices can has one number sequence generator, and the number sequence generator can generate one of the first target numbers when the corresponding memory device receives the first start command. The first target numbers generating by the memory devices may be different or some of the first target numbers may be the same. The number sequence generator may be a random number generator.

In a step S130, the memory devices may respectively perform counting actions to generate a plurality of first counting numbers. The memory devices also respectively compare the first target numbers with the first counting numbers to step a first time-up memory device of the memory devices in the step S130.

In detail, in an initial state, all of the memory devices are un-identified memory devices. When the memory devices receive the first start command, the memory devices respectively generate the first target numbers, and perform counting actions according to the first start command. Each of the memory devices compares the corresponding first target number with the corresponding first counting number. When the first counting number equals to the first target number, the corresponding memory device is the first time-up memory device can be determined.

It should be noted here, after the first time-up memory device is determined, the first identification period can be end by the controller, and the counting actions of all of the memory devices are terminated. In this embodiment, if the first counting number and the first target number of one of the memory devices (i.e. a memory device A) are equalled, the memory device A may inform the controller by a time-up signal, and the controller can end the first identification period according to the time-up signal, and stops the counting actions of all of the memory devices.

In a step S140, an identification code of the first time-up memory device can be set to a first value, and the first time-up memory device is turned to an identified memory device.

In detail, in the initial state, identification codes of all the memory devices are 0. In the step S140, when the first time-up memory device is determined, the identification code of the first memory device remains in 0, and the identification codes of others memory device are increased by 1. Such as that, the identification code of the first memory device can be set to 0 (the first value).

Please be noted here, for setting the identification codes of all of the memory devices, the steps S120 to S140 can be executed repeatedly for several times. A second identification period of the identification operation can be started by a second start command from the controller. In the second identification period, the un-identified memory devices can generate a plurality of second target numbers. The un-identified memory devices can perform second counting actions and compare second counting numbers with the second target numbers respectively to determine a second time-up memory device. After the second time-up memory device is determined, the second counting actions can be terminated by the controller, and the identification code of the second time-up memory device can be set.

Figure 2:
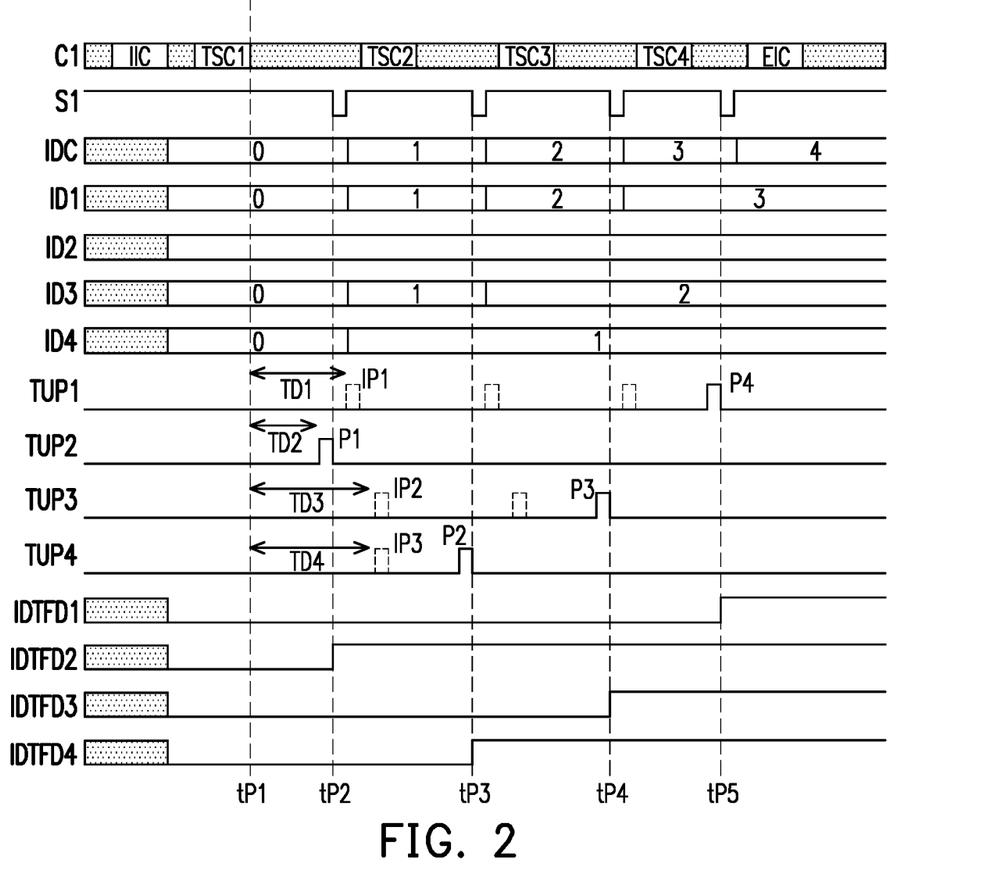
FIG. 2 is a waveform plot of the identification method of a multi-die memory apparatus according to an embodiment of present disclosure.

Please refer to FIG. 2, which is a waveform plot of the identification method of a multi-die memory apparatus according to an embodiment of present disclosure. In FIG. 2, a controller of the multi-die memory apparatus can send an identification initial command IIC by a signal port C1 to a plurality of memory devices. In this embodiment, take four memory devices disposed in the multi-die memory apparatus as an example. All of the memory devices may respectively reset a plurality identification codes ID1~ID4 to a first value (=0), and respectively reset flags IDTFD1~IDTFD4 to logic level 0 (a first logic level) according to the identification initial command IIC. Then, the controller sends the first start command TSC1, and counting actions of all of the memory devices are started at a time point tP1 according to the first start command TSC1. In this embodiment, the signal port C1 may be used to transmit identification commands for the identification method of present embodiment. On the other hand, the signal port C1 may be used to transmit data and/or commands for normal accessing operation (read operation and/or write operation) for the memory devices.

On the other hand, when the memory devices receive the first start command TSC1, the memory devices respectively generate four first target numbers TD1~TD4. Since the first target number TD2 is a minimum number of the four first target numbers TD1~TD4, the memory device corresponding to the first target number TD2 can be a first time-up memory device. Accordingly, a time-up signal TUP2 with an actual pulse P1 can be generated. Besides, the first time-up memory device also pulls up the flag IDTFD2 to a logic level 1 (a second logic level) at a time point tP2.

In really implement, all of the time-up signals TUP1~TUP4 may be tied together for generating a status signal S1. Such as that, information of all the time-up signals TUP1~TUP4 can be transported to the controller by a signal wire. In this embodiment, if an actually pulse is generated on any one of the time-up signals TUP1~TUP4, a low pulse can be generated on the status signal S1.

At the time point tP2, information of the first time-up memory device has been determined can be informed to the controller by the status signal S1. Such as that, the controller can end the first identification period, and stops all the counting actions of the memory devices. For some embodiments, the counting actions of the memory devices can be stopped by the memory devices themselves rather than the controller according to the status signal S1. Also, the controller can count a number of identified memory devices according to the status signal S1 to generate an identified count IDC. In detail, if there is one low pulse found in the status S1, the controller may increase the identified count IDC by 1. Furthermore, each of the memory devices which is not the first time-up memory device increases the identification code ID1, ID3 and ID4 by 1, and the first time-up memory device keeps the identification code ID2 on the first value (=0). That is, the identification code ID2 of the first time-up memory device (the identified memory device) is set to 0.

Since the first time-up memory device is determined at the time point tP2, all of the counting actions of the memory devices are stopped at the time point tP2, and imaginary pulses IP1~IP3 are not generated.

After the time point tP2, the controller may send a second start command TSC2 to start a second identification period. In the second identification period, all of un-identified memory devices start second counting actions according to the second start command TSC2. The un-identified memory devices respectively generate a plurality of second target numbers, and compare the second target numbers with a plurality of second counting numbers, respectively. Accordingly, a second time-up memory device can be determined, and another actual pulse P2 can be generated on the time-up signal TUP4 at a time point tP3, and a second low pulse can be generated on the status signal S1. Triggering by a negative edge of the status signal S1, the identified count IDC can be increased to 2 by the controller. Also, the identification codes ID1 and ID3 increase to 2 correspondingly, and the identification code ID4 keeps on 1. That is, the memory device corresponding to the identification code ID4 is set to a second identified memory device.

Furthermore, the controller can send a third start command TSC3 and a fourth start command TSC3 in sequence. Correspondingly, actual pulses P3 and P4 can be respectively generated on the time-up signals TUP3 and TUP1, and two low pulses can be generated on the status signal S1 at time points tP4 and tP5, respectively. When the identified count IDC equals to a total number of the memory devices (=4), the controller can send an identification end command EIC to end this identification operation. After the identification operation has been completed, the identification codes ID1~ID4 are respectively ser to 3, 0, 2 and 1. All of the memory devices are identified successfully.

In some embodiment, the identification codes ID1~ID4 can be respectively saved to the memory devices. The memory devices may be non-volatile memory devices, such as flash memory devices. Also, the memory devices may be volatile memory devices, such as dynamic or static random accessing memory (DRAM or SRAM) devices. For the volatile memory device cases, the identification codes ID1~ID4 may be generated after each of power up sequences, and the identification codes ID1~ID4 may be loss after power down. In some embodiments, the identification codes may be generated after each power up even if the memory device is non-volatile type.

Besides, the flags IDTFD1~IDTFD4 are respectively set to logic level 1 at the time points tP5, tP2, tP4 and tP3. When each of the flags IDTFD1~IDTFD4 is set logic level 1, the corresponding memory device is the identified memory device.

It should be noted here, the status signal S1 may be transmit by part of data pins of each of the memory devices. Or the status signal S1 may be transmit by any one specific pin in addition to data or control pin of each of the memory devices.

Figure 3:
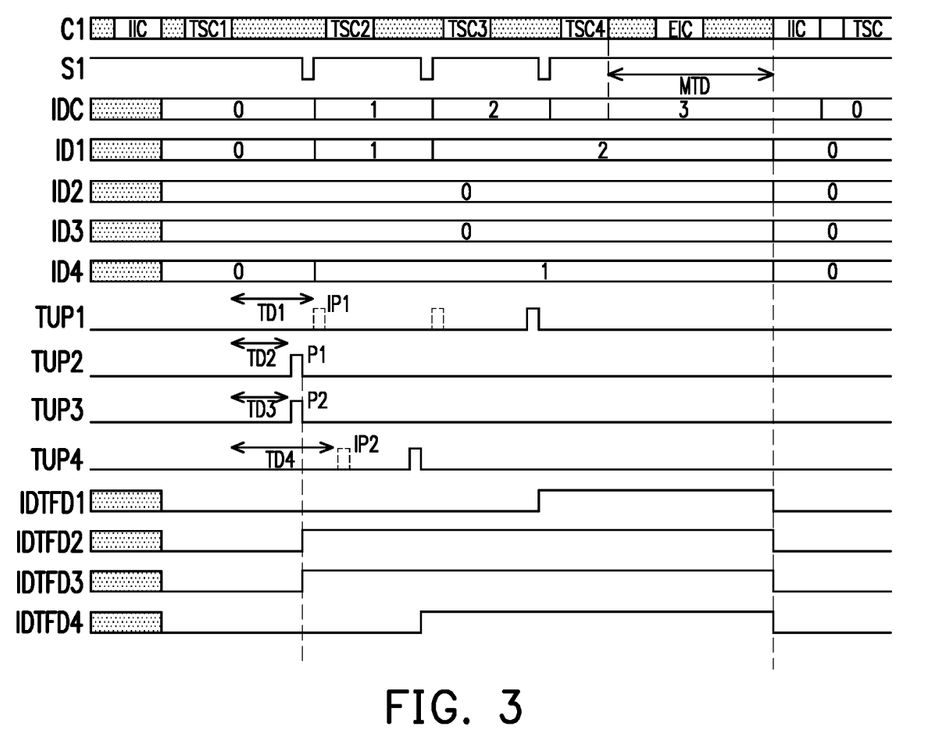
FIG. 3 is a waveform plot of the identification method of a multi-die memory apparatus according to another embodiment of present disclosure.

Please refer to FIG. 3, which is a waveform plot of the identification method of a multi-die memory apparatus according to another embodiment of present disclosure. Different from the embodiment in FIG. 2, the first target numbers TD2 and TD3 in this embodiment may be the same. Since the first target numbers TD2 and TD3 are the same, pulses P1, P2 on two time-up signals TUP2 and TUP3 respectively can be found, and a collision event is happened. In this case, two flags IDTFD2 and IDTFD3 are set to logic level 1 commonly, and both of the identification codes ID2 and ID3 are kept on the first value (=0) commonly. Moreover, after the fourth start command TSC4 has been sent, no pulse can be generated on any one of the time-up signals TUP1~TUP4. For this situation, the controller sets a delay time MTD, and calculates a waiting time for receiving pulse from any one of the time-up signals TUP1~TUP4. If the waiting time is larger than the delay time MTD, the controller can determine this identification operation is failed. Correspondingly, the controller can re-send the identification initial command IIC and the first start command TSC for re-starting a new identification operation and the first identification period.

Figure 4:
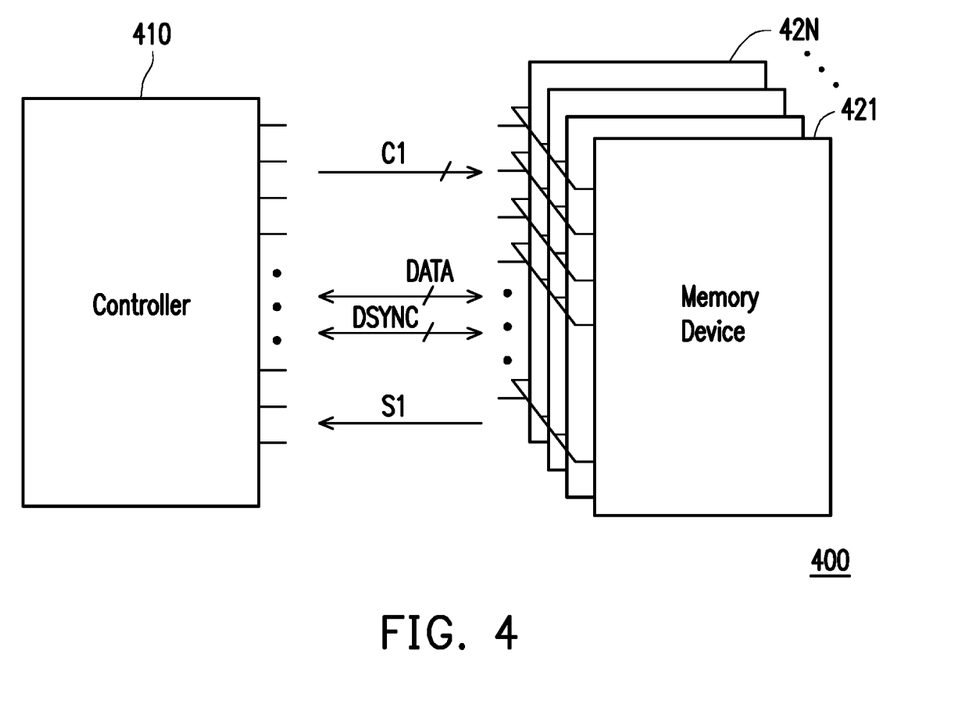
FIG. 4 is a schematic diagram of a multi-die memory apparatus according to an embodiment of present disclosure.

Please refer to FIG. 4, which is a schematic diagram of a multi-die memory apparatus according to an embodiment of present disclosure. The multi-die memory apparatus 400 includes a controller 410 and a plurality of memory devices 421~42N. The controller 410 is coupled to the memory devices 421~42N, and can send one or more commands to the memory devices 421~42N through a command port C1. The controller 410 and the memory devices 421~42N also can transport data signals DATA and a synchronization signal DSYNC with each other. Moreover, the memory devices 421~42N can commonly send a status signal S1 to the controller, where the status signal S1 is generated by a plurality of time-up signals of the memory devices 421~42N.

In hardware implementation, the status signal S1 can be pulled up by a weak pull high circuit. The weak pull high circuit may be a resistor or a transistor with a long length channel. Also, the time-up signals from the memory devices 421~42N can be respectively generated by a plurality of strong pull low circuit, such as a current sinker. That is, if one of the time-up signals is pulled to a low voltage level, the status signal S1 can be pulled to the low voltage level accordingly, and if none of the time-up signals is pulled to the low voltage level, the status signal S1 can be pulled on a high voltage level.

In this embodiment, the controller can send an identification initial command and a plurality of start commands to enable an identification operation on the memory devices 421~42N. The memory devices 421~42N can respectively generate the time-up signals, and the status signal generated by the time-up signals can be sent back to the controller 410. The controller 41 can control a flow of the identification operation according to the status signal S1, and a plurality of identification codes of the memory devices 421~42N can be set accordingly. Detail operations of the identification operation has been detailly described in above embodiments, and no more repeated description here.

It should be noted here, the memory devices 421~42N may be connected to each other by a plurality of through-silicon-vias (TSVs), and the multi-die memory apparatus 400 can be implemented in the three-dimension (3D) integrated circuit (IC) packaging technology.

Figure 5:
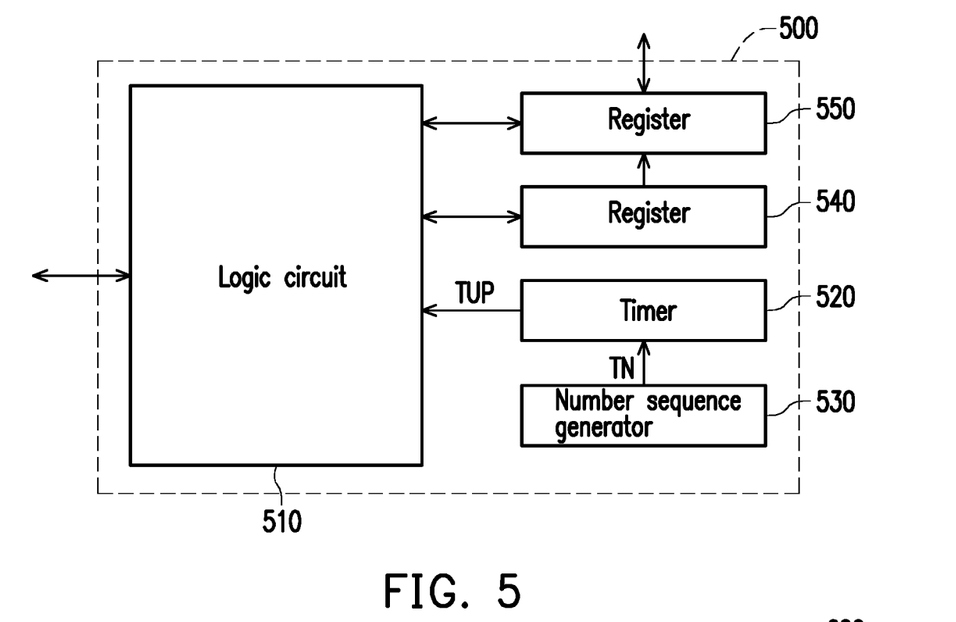
FIG. 5 is a block diagram of a memory device of a multi-die memory apparatus according to an embodiment of present disclosure.

Please refer to FIG. 5, which is a block diagram of a memory device of a multi-die memory apparatus according to an embodiment of present disclosure. The memory device 500 includes a logic circuit 510, a timer 520, a number sequence generator 530 and registers 540 and 550. The number sequence generator 530 is used to generate a target number TN according to a start command sent by a controller in the multi-die memory apparatus. The number sequence generator 530 can be a random number generator, and can be implemented by a linear feedback shift registers (LSFR). The timer 520 is coupled to the number sequence generator 530 and the logic circuit 510. The timer 520 can perform a counting action, and compare a counting number with the target number TN to generate a time-up signal TUP. In this embodiment, the timer 520 can be implemented by a digital counter and performs the counting operation based on a clock. Also, the timer 520 can be implemented by an analogy circuit without the clock signal, where the analogy circuit can decide a delay time according to the target number TN, and decide a time point for generating a pulse on the time-up signal TUP according to the delay time.

The registers 540 and 550 are coupled to the logic circuit 510. The register 550 is used to recode an identification code of the memory device 500, and the identification code of the memory device 500 can be increased or kept unchanged according to a command from the logic circuit 510. The register 540 is used to record a flag and set the flag to a first logic value in an initial state. The register 540 sets the flag to a second logic value if the memory device 500 is a identified memory device. The register 540 is also controlled by the logic circuit 510.

On the other hand, the logic circuit 510 is also used to receive the time-up signal TUP and determine whether the memory device 500 is a time-up memory device or not. If the memory device 500 is not the time-up memory device, the logic circuit 510 can send the command to the register 550 for increasing the identification code by 1. On the contrary, if the memory device 500 is the time-up memory device, the logic circuit 510 keeps the identification code in the register 550 unchanged.

Figure 6:
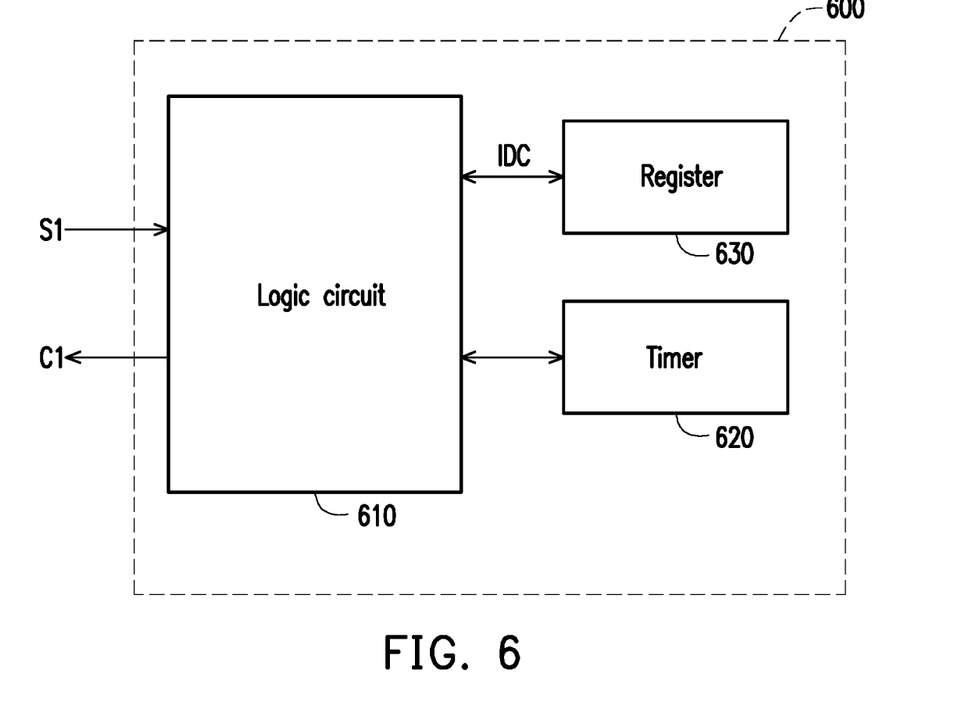
FIG. 6 is a block diagram of a controller of a multi-die memory apparatus according to an embodiment of present disclosure.

Please refer to FIG. 6, which is a block diagram of a controller of a multi-die memory apparatus according to an embodiment of present disclosure. In FIG. 6, the controller 600 includes a logic circuit 610, a timer 620 and a register 630. The timer 620 is configured to counting a delay time, and the timer 620 can be used to determine whether the first pulse of a status signal S1 is received or not during the delay time. If the first pulse is received during the delay time, the timer 620 can inform the logic circuit 610 that an identification operation of the multi-die memory apparatus is normal. On the contrary, if the first pulse is not received during the delay time, the timer 620 can inform the logic circuit 610 that the identification operation of the multi-die memory apparatus is abnormal. Such as that, the logic circuit 610 can re-send an identification initial command and a first start command to restart the identification operation.

The register 630 is configured to count a pulses number of the status signal and record a number of a plurality of identified memory devices IDC. The logic circuit 610 can send start command to the memory devices according to the number of the identified memory devices (an identified count IDC). Also, the logic circuit 610 can send an identification end command when the identified count IDC equals to a total number of the memory devices.

On the other hand, the logic circuit 610 receives the status signal S1 and send command through a command port C1. The logic circuit 610 can send identification initial command and corresponding start commands through the command port C1 to control a flow of the identification operation. The logic circuit 610 also receives the status signal S1, and controls the flow of the identification operation according to the status signal S1, too.

About hardware structure, in FIG. 5 and FIG. 6, the logic circuits 510 and 610 can be implemented by a plurality of logic circuit components, and designed by any technology known by a person skilled in the art. The timer 620 can be a digital circuit, and performs a counting operation based on a clock. The resisters 540, 550 and 630 can be implemented by a plurality of flip-flops.

Based on the above, according to the present invention, the memory devices in the multi-die memory apparatus can set a plurality of target numbers during an identification operation. The memory devices also perform counting operations, and determine a first time-up memory device by comparing a plurality counting numbers and the target numbers. Such as that, identification codes of the memory devices can be determined accordingly, and the identification operation can be completed without special bonding structure.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. An identification method for a multi-die memory apparatus, comprising:
   sending an identification initial command and a first start command to a plurality of un-identified memory devices by a controller for starting a first identification period;
   generating each of a plurality of first target numbers by each of the un-identified memory devices according to a random number generating scheme;
   starting each of a plurality of first counting actions at a same time point by each of the un-identified memory devices and comparing each of a plurality of first counting numbers with each of the first target numbers by each of the un-identified memory devices to set a first time-up memory device, wherein each of the first counting actions is independent to each other; and
   setting an identification code of the first time-up memory device of the un-identified memory devices to be a first value, wherein a set of starting each of the first counting actions at a same time point by each of the un-identified memory devices and comparing each of the first counting numbers with each of the first target numbers by each of the un-identified memory devices to set the first time-up memory device comprises: respectively generating each of a plurality of time-up signals by each of the un-identified memory devices, and generating a status signal by combining the time-up signal; and receiving the status signal by the controller, and ending the identification period according to a first pulse of the status signal.

2. The identification method according to the claim 1, further comprising:
   ending the first identification period after the first time-up memory device being determined.

3. The identification method according to the claim 1, further comprising:
   setting a delay time; and
   if the first pulse of the status signal is not received by the controller after the delay time, re-sending the identification initial command and the first start command by the controller for re-starting the first identification period.

4. The identification method according to the claim 1, further comprising:
   sending a second start command to the memory devices by the controller for starting a second identification period;
   generating each of a plurality of second target numbers by each of the un-identified memory devices;
   performing each of second counting actions and comparing each of a plurality of second counting numbers with each of the second target numbers by each of a plurality of un-identified memory devices to set a second time-up memory device of the un-identified memory devices; and
   setting an identification code of the second time-up memory device of the un-identified memory devices to be a second value.

5. The identification method according to the claim 4, wherein a step of setting the identification code of the first time-up memory device of the un-identified memory devices to be the first value comprises:
   resetting the identification codes of all of the un-identified memory devices to be the first value;
   increasing the identification code of each of the un-identified memory devices which is not the first time-up memory device by 1; and
   keeping the identification code of the first time-up memory device on the first value.

6. The identification method according to the claim 5, wherein a step of setting the identification code of the second time-up memory device of the un-identified memory devices to be the second value comprises:
   increasing the identification code of each of the un-identified memory devices which is not the second time-up memory device by 1; and
   keeping the identification code of the second time-up memory device on the second value.

7. The identification method according to the claim 1, further comprising:
   counting a number of a plurality of identified memory devices by the controller; and
   if the number of the identified memory devices equals to a total number of the memory devices, terminating an action of the first identification enable command.

8. The identification method according to the claim 1, wherein a step of respectively generating the first target numbers by the memory devices comprises:
   respectively providing a plurality of number sequence generators in the memory devices; and
   respectively generating the first target numbers by the memory devices during the first identification period.

9. The identification method according to the claim 8, wherein the number sequence generators respectively are random number generators.

10. The identification method according to the claim 1, further comprises:

providing a plurality of flags respectively corresponding to the memory devices;

setting all of the flags to a first logic value in an initial state; and setting each of the flags corresponding to each of the memory devices which is an identified memory device to a second logic value.

11. A multi-die memory apparatus, comprising:

a controller; and a plurality of memory devices, coupled to the controller, wherein, the controller is configured to send an identification initial command and a first start command to the memory devices for starting a first identification period, and a plurality of un-identified memory devices of the memory devices are configured to:

generate each of a plurality of first target numbers by each of the un-identified memory devices according to a random number generating scheme;

perform each of a plurality of first counting actions and compare each of a plurality of first counting numbers with each of the first target numbers to set a first time-up memory device of the memory devices, wherein each of the first counting actions is independent to each other; and set an identification code of the first time-up memory device of the un-identified memory devices to be a first value, wherein the un-identified memory devices are further configured to: generate each of a plurality of time-up signals by each of the un-identified memory devices, and generate a status signal by combining the time-up signals, and the controllers further configured to: receive the status signal, and end the identification period according to a first pulse of the status signal.

12. The multi-die memory apparatus according to claim 11, wherein the controller is further configured to:

end the identification period after the first time-up memory device being determined.

13. The multi-die memory apparatus according to claim 11, wherein the controller is further configured to:

set a delay time, and if the first pulse of the status signal is not received after the delay time, re-send a second identification enable command to the memory devices to start a second identification period.

14. The multi-die memory apparatus according to claim 13, wherein the controller comprises:

a timer, being configured to determine whether the first pulse of the status signal is received or not during the delay time;

a register, being configured to count a pulses number of the status signal and record a number of a plurality of identified memory devices; and a logic circuit coupled to the register and the timer, the logic circuit being configured to:

send the identification initial command and the first start command to the memory devices for starting the first identification period;

receive the status signal, and end the identification period according to the first pulse of the status signal; and if the first pulse of the status signal is not received after the delay time, re-send the second identification enable command to the memory devices to start the second identification period.

15. The multi-die memory apparatus according to claim 11, wherein each of the memory devices comprises:

a number sequence generator, generating corresponding first target number;

a timer, generating corresponding first counting number, and generating a time-up signal according to the corresponding first target number and the corresponding first counting number;

a first register, storing corresponding identification code; and a logic circuit, coupled to the number sequence generator, the timer and the first register, being configured to:

determine whether corresponding memory device is a time-up memory device or not;

increase the identification code by 1 if the corresponding memory device is not the time-up memory device; and keep the identification code unchanged if the corresponding memory device is the time-up memory device.

16. The multi-die memory apparatus according to claim 15, wherein each of the memory devices further comprises:

a second register, coupled to the logic circuit, recording a flag and setting the flag to a first logic value in an initial state, and setting the flag to a second logic value if the corresponding memory device is a identified memory device.

17. The multi-die memory apparatus according to claim 11, wherein the controller is further configured to:

send a second identification enable command to the memory devices to start a second identification period;

and the un-identified memory devices are further configured to:

respectively generating a plurality of second target numbers;

respectively performing second counting actions and comparing a plurality of second counting numbers with the second target numbers to set a second time-up memory device of the un-identified memory devices; and set an identification code of the second time-up memory device of the un-identified memory devices to be a second value.

18. The multi-die memory apparatus according to claim 15, wherein the number sequence generator is a random number generator.

* * * * *